United States Patent
Spitz et al.

(10) Patent No.: US 8,969,995 B2
(45) Date of Patent: Mar. 3, 2015

(54) SEMICONDUCTOR DEVICE AND RECTIFIER SYSTEM

(75) Inventors: Richard Spitz, Reutlingen (DE); Alfred Goerlach, Kusterdingen (DE); Gert Wolf, Affalterbach (DE); Markus Mueller, Heilbronn (DE)

(73) Assignee: Robert Bosch GmbH, Stuttgart (DE)

( * ) Notice: Subject to any disclaimer, the term of this patent is extended or adjusted under 35 U.S.C. 154(b) by 583 days.

(21) Appl. No.: 11/667,050

(22) PCT Filed: Oct. 11, 2005

(86) PCT No.: PCT/EP2005/055164
§ 371 (c)(1), (2), (4) Date: Oct. 2, 2007

(87) PCT Pub. No.: WO2006/056505
PCT Pub. Date: Jun. 1, 2006

(65) Prior Publication Data
US 2008/0122323 A1    May 29, 2008

(30) Foreign Application Priority Data
Nov. 24, 2004  (DE) .......................... 10 2004 056 663

(51) Int. Cl.
*H01L 27/08* (2006.01)
*H01L 29/872* (2006.01)
(Continued)

(52) U.S. Cl.
CPC .......... *H01L 29/8725* (2013.01); *H01L 25/072* (2013.01); *H01L 25/16* (2013.01); *H01L 27/0814* (2013.01); *H01L 29/872* (2013.01); *H01L 2924/0002* (2013.01)

USPC ........... 257/476; 257/471; 257/473; 257/475; 257/E27.051; 438/92; 438/172; 438/570

(58) Field of Classification Search
CPC . H01L 29/872; H01L 29/66143; H01L 29/47; H01L 27/814; H01L 29/00; H01L 21/28537; H01L 29/0692; H01L 29/1608; H01L 29/475; H01L 21/28581; H01L 27/00
USPC ............. 257/471–478; 438/92, 172, 570, 572
See application file for complete search history.

(56) References Cited

U.S. PATENT DOCUMENTS 4,059,778 A * 11/1977 Sohnle ........................ 310/68 D
4,142,893 A    3/1979 Adlerstein et al.
(Continued)

FOREIGN PATENT DOCUMENTS

DE    4225359    * 7/1992 ............. H02K 11/00
DE    19545234    5/1997
(Continued)

OTHER PUBLICATIONS

Wikipedia Web article about magnetorestance date Dec. 24, 2010, 4 pages.*

*Primary Examiner* — Thinh T Nguyen
(74) *Attorney, Agent, or Firm* — Kenyon & Kenyon LLP

(57) ABSTRACT

High-efficiency Schottky diodes (HED) and rectifier systems having such semiconductor devices are provided, which Schottky diodes (HED) are composed of at least one Schottky diode combined with an additional semiconductor element, e.g., with magnetoresistors (TMBS) or with pn diodes (TJBS), and have trenches. Such high-efficiency Schottky diodes make it possible to construct rectifiers which are suitable for higher temperatures and can therefore be used in motor vehicle generators, without particular cooling measures such as heat sinks being required.

27 Claims, 5 Drawing Sheets

(51) Int. Cl.
*H01L 25/07* (2006.01)
*H01L 25/16* (2006.01)

(56) References Cited

U.S. PATENT DOCUMENTS

| | | | | |
|---|---|---|---|---|
| 4,305,121 A | * | 12/1981 | Lack et al. | 363/141 |
| 4,862,229 A | | 8/1989 | Mundy et al. | |
| 4,982,260 A | * | 1/1991 | Chang et al. | 257/656 |
| 5,241,195 A | * | 8/1993 | Tu et al. | 257/155 |
| 5,262,668 A | * | 11/1993 | Tu et al. | 257/475 |
| 5,262,669 A | | 11/1993 | Wakatabe et al. | |
| 5,365,102 A | | 11/1994 | Mehrotra et al. | |
| 5,371,400 A | | 12/1994 | Sakurai et al. | |
| 5,612,567 A | * | 3/1997 | Baliga | 257/475 |
| 6,078,090 A | * | 6/2000 | Williams et al. | 257/476 |
| 6,127,812 A | * | 10/2000 | Ghezzo et al. | 320/166 |
| 6,259,587 B1 | * | 7/2001 | Sheldon et al. | 361/23 |
| 6,362,495 B1 | * | 3/2002 | Schoen et al. | 257/77 |
| 6,404,033 B1 | * | 6/2002 | Chang et al. | 257/484 |
| 6,501,146 B1 | | 12/2002 | Harada | |
| 6,717,229 B2 | * | 4/2004 | Buchanan et al. | 257/475 |
| 6,731,081 B2 | * | 5/2004 | Kusase et al. | 318/140 |
| 6,787,871 B2 | * | 9/2004 | Asano et al. | 257/471 |
| 6,806,548 B2 | * | 10/2004 | Shirai et al. | 257/473 |
| 2002/0179993 A1 | | 12/2002 | Hshieh et al. | |

FOREIGN PATENT DOCUMENTS

| | | | |
|---|---|---|---|
| DE | 694 28 996 T2 | 6/2002 | |
| EP | 1 411 551 | 4/2004 | |
| JP | 52-75466 | 12/1950 | |
| JP | 63-240336 | 10/1988 | |
| JP | 3-105975 | 5/1991 | |
| JP | 4-321274 | 11/1992 | |
| JP | 6-151816 | 5/1994 | |
| JP | 8-116072 | 5/1996 | |
| JP | 8-512430 | 12/1996 | |
| JP | 2000-10110 | 1/2000 | |
| JP | 2001-275361 | 10/2001 | |
| JP | 2002-83976 | 3/2002 | |
| JP | 02003023798 A * | 1/2003 | H02K 21/14 |
| JP | 2004-140068 | 5/2004 | |
| JP | 2004-529506 | 9/2004 | |
| KR | 20010003670 | 1/2001 | |
| WO | WO 95/02258 | 1/1995 | |

* cited by examiner

Fig. 7a
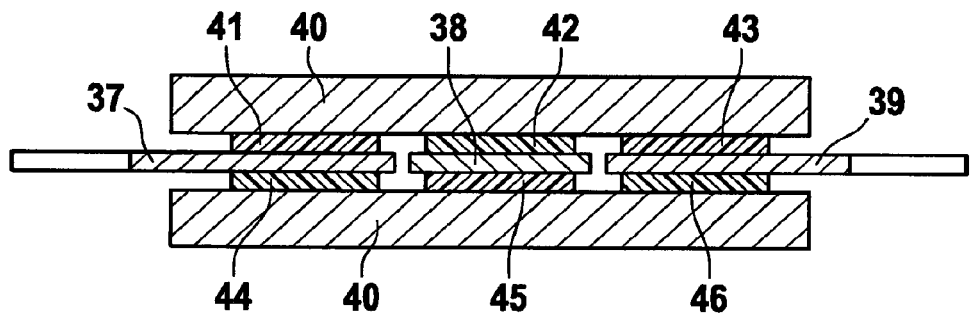
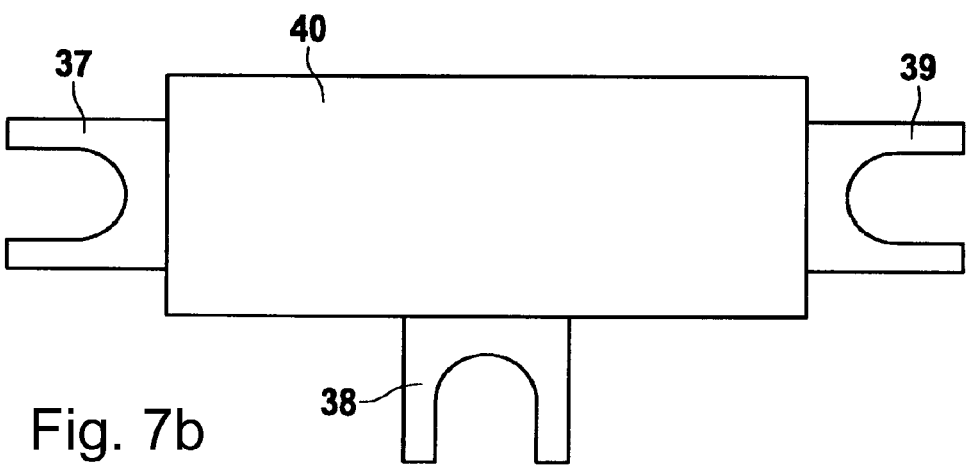
Fig. 7b

SEMICONDUCTOR DEVICE AND RECTIFIER SYSTEM

This is a continuation of PCT Application PCT/EP05/55164 filed on Oct. 2, 2007, which claims priority to German Patent Application (DE) 10 2004 056 663.1 filed on Nov. 24, 2004.

BACKGROUND OF THE INVENTION

1. Field of the Invention

The present invention relates to a semiconductor device and a rectifier system having such a semiconductor device.

2. Description of Related Art

In three-phase generators and dynamos, AC bridges or rectifiers are used for rectification. In general, the rectifiers are composed of six semiconductor diodes having a silicon pn junction. These diodes are designed for operating at high currents (e.g., current density up to 500 A/cm$^2$) and high temperatures (e.g., junction temperature Tj<225° C.). The voltage drop in the direction of flux, forward voltage UF, is typically approximately 1 volt for the high currents used. When operating in the reverse direction, in general only a very small blocking-state current IR flows up to a breakdown voltage UZ. Starting at this voltage, the blocking-state current increases strongly. This prevents a further increase in the voltage.

A distinction is made between high-blocking diodes (HS diodes) having a UZ approximately in the range between 200 V and 400 V and Z diodes having blocking-state voltages of approximately 20 V to 40 V, depending on the electric system voltage of the motor vehicle. The high-blocking diodes (HS diodes) must not be operated in breakdown mode. Z diodes may also be operated in breakdown mode, briefly even at very high currents. They are therefore used for limiting the overshooting generator voltage in the event of load variations or load dump.

The forward voltage of the pn diodes which results in conducting-state power losses and therefore in impaired generator efficiency represents a certain disadvantage. Since on the average always two diodes are connected in series, the average conducting-state power losses in the case of a 100 A generator are approximately 200 W. The associated heating of diodes and rectifiers must be mitigated by using complex cooling measures (heat sinks, fans).

To reduce the conducting-state power losses, the present invention provides for the use of Schottky diodes (Schottky Barrier Diodes, SBD) instead of pn diodes. Schottky diodes are metal-semiconductor junctions which have an electrical characteristic similar to that of pn diodes. Contrary to pn diodes, in the case of Schottky diodes the forward voltage may be freely selected within certain limits by selecting the metal and, more importantly, may be adjusted to values that are lower than in the case of pn diodes. Thus, for example, forward voltages UF of 0.5 V to 0.6 V may be implemented without difficulty. The selection of the metal essentially defines the (power) barrier height PhiBn. Only electrons capable of overcoming this barrier contribute to the current flow. The barrier height may be influenced by a suitable selection of the "barrier metal." In addition, barrier height PhiBn is also a function of the semiconductor used (semiconductor material: covalent or ionic semiconductor, n or p doping, etc.).

The relationship between forward current density jF and blocking-state current density jR is described by the following formula (see for example, the textbook "Power Semiconductor Devices" by B. J. Baliga, PWS Publishing Company, Boston, 1996):

$$jR = jF \cdot \exp\left(\frac{-q \cdot UF}{k \cdot Tj}\right) \qquad (1)$$

where q is the elementary electric charge and k is Boltzmann's constant. Tj is the junction temperature of the diode in Kelvins. It is apparent that the blocking-state currents are high when the forward voltage is selected to be small. However, the blocking-state current may be selected to be sufficiently small for use in the generator by a suitable choice of UF. (Trade-off between forward voltage and blocking-state current.)

The above formula (1), however, describes only the boundary case of an ideal Schottky diode. In addition to the technology-based shortcomings, this formula does not describe, in particular, the relationship between the blocking-state current and the blocking-state voltage. This relationship causes the blocking-state current to increase far beyond the current values described by formula 1 when the blocking-state voltage increases. This is because of a reduction in the barrier height PhiBn with increasing blocking-state voltage. This relationship is also known as image force effect or Schottky effect or barrier lowering effect (BL). The blocking-state power losses generated by the blocking-state currents in conventional Schottky diodes are, in particular at the high temperatures occurring in the use of generators, in general so high that the system becomes thermally unstable.

Schottky diodes may in principle also be operated in blocking-state voltage breakdown, i.e., as Z diodes. Since the Schottky contact is located on the surface of the semiconductor, it is somewhat prone to crystal imperfections and contamination. Therefore, reliability in Z operation is often limited and, in general, is not allowed.

The semiconductor device of the generic type is a combination of a conventional Schottky diode with another semiconductor structure designed using trench technology and has a trench structure. The semiconductor device is also well suited as a Zener diode and may be used for use in a rectifier for a generator in a motor vehicle.

Published German patent document DE 694 28 996 describes semiconductor devices having structures including a combination of conventional Schottky diodes (SPD) with another semiconductor structure, namely a magnetoresistor, having a trench structure. The structure is composed of a plurality of cells. This type of Schottky diode is also known as Trench MOS Barrier Schottky (TMBS) diode.

BRIEF SUMMARY OF THE INVENTION

The semiconductor device according to the present invention has the advantage that, on the one hand, it is very sturdy and, on the other hand, it has a very low blocking-state current. This advantage is achieved in that the semiconductor device is designed as a high-efficiency Schottky diode (HED) and has no barrier-lowering effect (BL). This ensures the low blocking-state current.

Particularly advantageous is the total power loss curve of the semiconductor device according to the present invention which is characterized, compared to conventional Schottky diodes, in that at higher temperatures the power loss increases considerably less sharply, and in particular at higher temperatures than in conventional Schottky diodes it even drops.

The semiconductor devices according to the present invention may be installed in rectifier systems which are to be suitable for high power levels and must not exceed certain temperatures. Such rectifiers include, for example, rectifiers for three-phase generators in motor vehicles in which six semiconductor devices according to the present invention are used. The low power loss allows particularly simple designs of the semiconductor device systems to be implemented.

In advantageous embodiments, the heat sink, which is needed when using conventional rectifiers, may be omitted.

The present invention provides for the use of a novel type of Schottky diode—in the present invention referred to as a high-efficiency Schottky diode (HED)—instead of conventional Schottky diodes in rectifiers for generators. These diodes may be operated at higher junction temperatures Tj than regular Schottky diodes and therefore are suitable, for the first time, for operation in generators. The low conducting-state power losses increase the efficiency and the output power of the generator.

The high-speed switching of the Schottky diodes also improves the radio interference suppression of the generator by up to 10 dB in certain frequency ranges.

Due to the lower blocking-state power losses, the complexity for cooling the diodes may be reduced compared to pn diodes. In addition, the lower diode temperatures increase the degree of freedom for the design of the rectifier (partitioning). Even Zener-type operation (Z operation) is possible, at least for some variants of HED. Diodes that no longer have a barrier lowering effect (BL) and therefore have lower blocking-state currents are referred to as high-efficiency Schottky diodes HED. Formula 1 may also be applied to HEDs. The total power loss is composed of conducting-state and blocking-state power losses. In general, the following formula applies for total power loss P:

$$P = 0.5 \cdot UF \cdot IF + 0.5 \cdot IR \cdot UR \quad (2)$$

where UF is the forward voltage, IF is the forward current, IR is the blocking-state current, and UR is the blocking-state voltage. The dependence of blocking-state current and forward voltage on the temperature is also described in the above-mentioned textbook, where a formula for the effect of the blocking-state voltage on the blocking-state current (BL) is also provided. Using these relationships, which are known to those skilled in the art, the power loss of a conventional Schottky diode (having a BL effect) may be compared with the power loss of an HED (without BL effect) with the aid of formula 2.

BRIEF DESCRIPTION OF THE SEVERAL VIEWS OF THE DRAWING

FIGS. 6a, 6b, 6c, 7a and 7b show the partitioning of three chips and six chips, respectively, in particular in a housing.

DETAILED DESCRIPTION OF THE INVENTION

Figure 1:
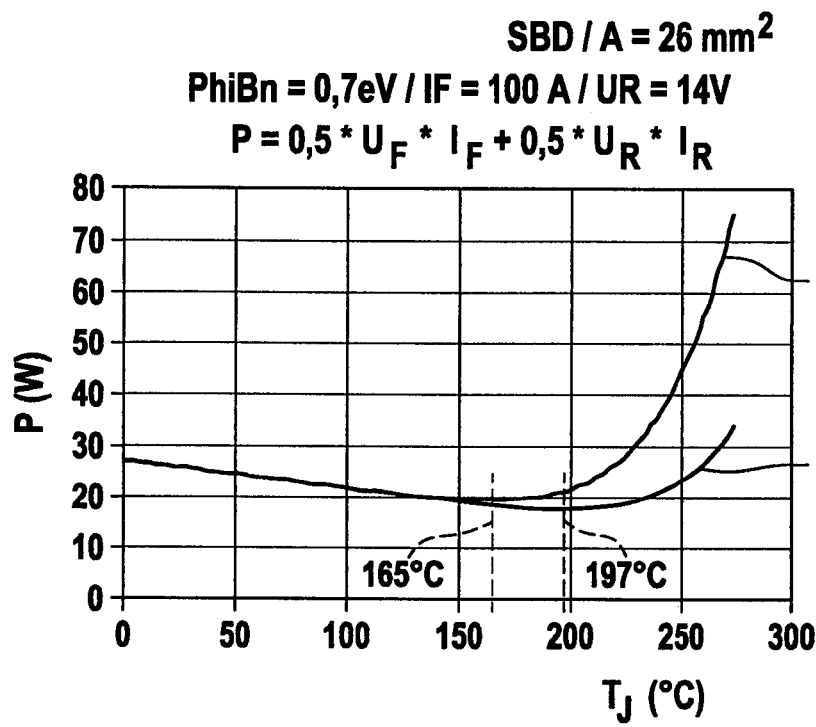
FIG. 1 shows the total power loss plotted against the junction temperature for conventional Schottky diodes and the semiconductor devices according to the present invention, i.e., TMBS diodes.

In FIG. 1 the comparison of the total power loss of a conventional Schottky diode with a high-efficiency Schottky diode HED is plotted as a function of the temperature. The effect of the BL on the total power loss of a Schottky diode is indicated in the case of a barrier height PhiBn=0.7 eV and a chip surface area A=26 mm². In the example, the forward current IF=100 A and the blocking-state voltage UR=14 V. The upper curve corresponds to the conventional Schottky diode with barrier lowering and the lower curve corresponds to the high-efficiency Schottky diode without barrier-lowering.

The low power loss of approximately 25 Watt of the diode initially drops with increasing temperature due to the negative temperature coefficient of the forward voltage of a Schottky diode—as in the case of a pn diode. However, in the case of the pn diode the power loss would be approximately twice as high. At higher temperatures, however, the total power loss increases due to the positive temperature coefficient of the blocking-state current. The maximum permissible junction temperature $T_J$ is determined by the point of inflection of the temperature/total power loss curve. In the depicted example, the maximum permissible junction temperature $T_J$ may be raised from 165° to 197° by using a high-efficiency Schottky diode. The use of such diodes in rectifiers for generators in which temperatures over 165° may occur, but remain below 197°, is thus possible.

Figure 2:
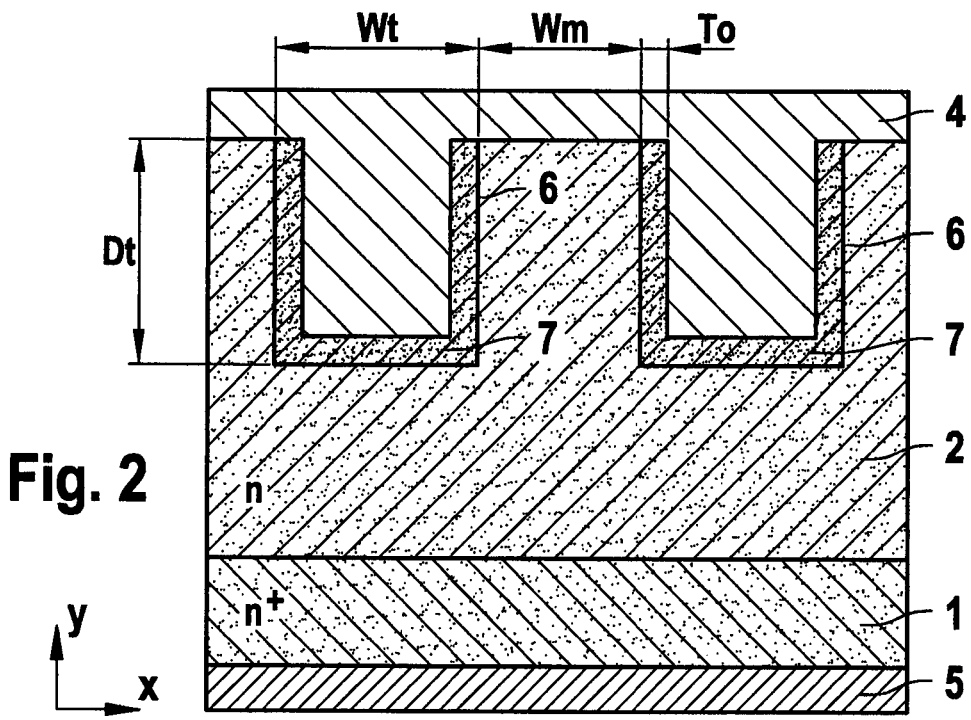
FIG. 2 shows the cross section (detail) of a TMBS diode.

FIG. 2 shows an example of a high-efficiency Schottky diode, where the cross section of a trench MOS barrier Schottky diode TMBS is depicted in a detail. Such high-efficiency Schottky diodes have a combination, monolithically integrated on a semiconductor chip, of a conventional Schottky diode (SBD) together with other elements such as magnetoresistors, pn junctions, or different barrier metals. They are designed using trench technology, i.e, the HED contains at least a few trench structures. The trenches are typically approximately 1 μm to 3 μm deep and approximately 0.5 μm to 1 μm wide. The distance between trenches is in the range of 0.5 μm to 1 μm. FIG. 2 shows two such cells; however, the diode itself contains a plurality of such cells. The depicted type of Schottky diode is referred to in the following as trench-MOS barrier Schottky diode TMBS.

The TMBS diode has an n⁺ substrate 1, an n epitaxial layer 2, at least two trenches 6 implemented in n epitaxial layer 2 by etching, metal layers on the front of chip 4 as an anode and on the back of chip 5 as a cathode, and an oxide layer 7 between trenches 6 and metal layer 4. Electrically the TMBS is a combination of an MOS structure (metal layer 4, oxide layer 7, and n epitaxial layer 2) and a Schottky diode (Schottky barrier between metal layer 4 as the anode and the n epitaxial layer 2 as the cathode). Currents flow in the flow direction through the mesa region between trenches 6. Trenches 6 themselves are not available for the current flow.

The advantage of a TMBS is in the reduction of the blocking-state currents. In the blocking direction, space charge zones are formed in both the MOS structure and the Schottky diode. The space charge zones expand with increasing voltage and they come into contact with each other in the middle of the area between neighboring trenches 6 at a voltage that is less than the breakdown voltage of the TMBS. The Schottky effects responsible for the high blocking-state currents are thus screened and the blocking-state currents are reduced. This screening effect is highly dependent on structure parameters Dt (trench depth), Wm (trench spacing), Wt (trench width), and To (oxide layer thickness), see FIG. 2.

Other possibilities for HED structures are, for example, the combination of Schottky diodes with pn diodes in the trench, etc. In general, all combinations of Schottky diodes with magnetoresistors such as in the TMBS, with pn diodes such as in the TJBS, and other components having Schottky diodes should be referred to as high-efficiency diodes HED if they have at least one trench.

The previously known combination components having trench structures are mainly designed for very low forward voltages UF, for example, UF=0.4 V. Areas of application include, for example, uninterruptible power supplies which require a very low forward voltage UF, but need not be operated at high temperatures. The forward voltage is set by selecting a metal having an appropriate (low) barrier height PhiBn. This results in a relatively high IR and low maximum permissible operating temperature. These structures are not suitable for application in generators.

In a high-efficiency Schottky diode for generator application, the barrier height is designed in such a way that somewhat higher conducting-state voltages UF, for example, UF=0.5 V to 0.6 V but, at the same time, lower blocking-state currents occur. Barrier heights of approximately 0.65 eV to 0.75 eV are preferably selected.

In general, a system such as shown in FIG. 2 cannot be reliably operated in blocking-state voltage breakdown.

At breakdown, very high electric fields are formed within oxide layer 7 and directly in the vicinity of the oxide layer in n epitaxial layer 2. The blocking-state currents flow mainly through a quasi-inversion layer of the MOS structure along the trench surface. As a result, the MOS structure may be degraded by injection of "hot" charge carriers from n epitaxial layer 2 into oxide layer 7 and even destroyed under certain operating conditions. If voltage limitation is still desired in the case of load dump, conventional Z diodes may also be connected in parallel to the HEDs in the rectifier. In this case, the breakdown voltage of the HED must be selected to be greater than in the case of the Z diode. The HEDs will then conduct the current in the forward direction, while the breakdown takes place exclusively in the Z diode. In addition, structures are also conceivable which have an (additional) integrated pn junction, for example, which determines the breakdown voltage. Such HEDs may even be used directly as Z diodes.

The use of high-efficiency Schottky diodes allows the cooling surface to be substantially reduced due to the low power loss of the diodes when they are used in a rectifier. It is therefore possible to entirely omit a heat sink or to substantially reduce the size of the positive and negative heat sinks compared to conventional rectifiers. This results in novel partitioning options which do not exist when using conventional diodes because of the high component temperatures. Such partitioning options are illustrated in the following figures. The following relationship applies: Lower power results in lower temperature and therefore makes it possible to partition the rectifier differently than before.

Figure 3A:
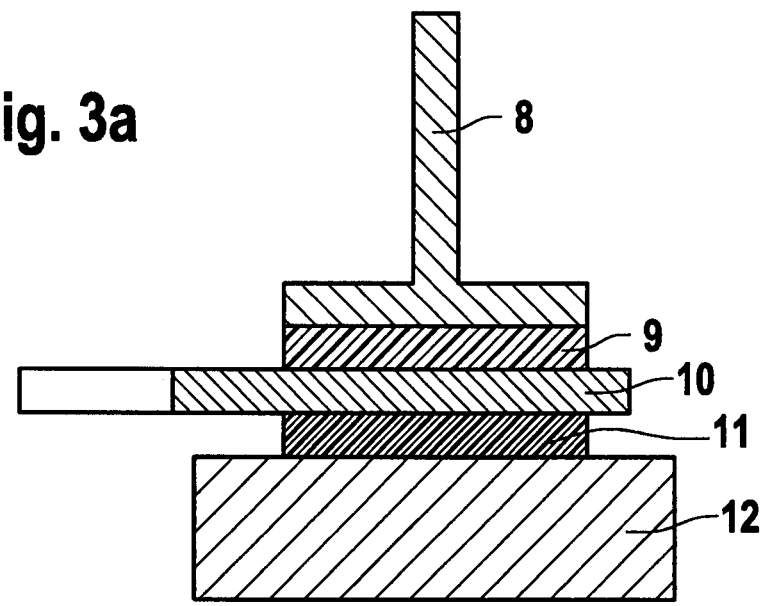
FIGS. 3a and 3b show a rectifier having two encapsulated chips in side sectional view and in top view.
Figure 3B:
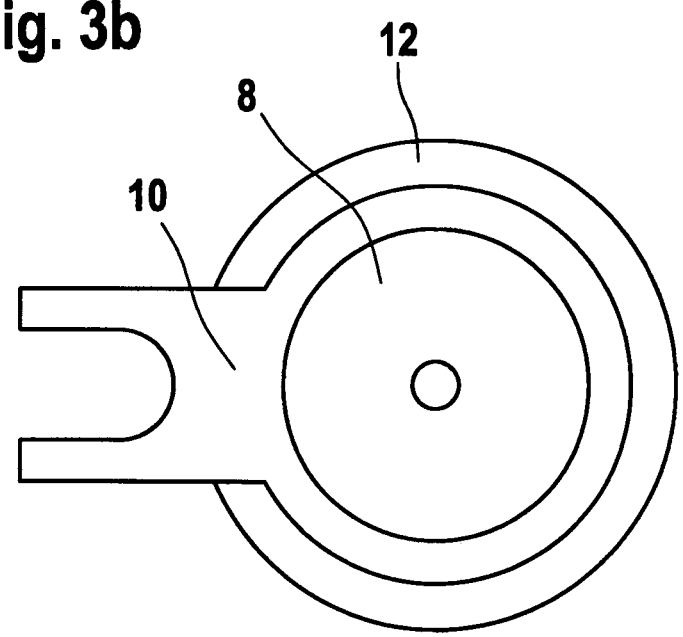

FIGS. 3a and 3b show a first example embodiment of a system according to the present invention of two diode chips for forming a rectifier in a package. The partitioning is selected in such a way that both positive and negative diodes are situated in a housing and the diode itself is designed as a press-in diode. Such a rectifier system for a generator in a motor vehicle is only possible from the temperature point of view because the heat loss in HED elements is lower than in conventional diodes.

In particular, FIG. 3a shows a lateral cross section and FIG. 3b shows a top view. The overall system is composed of a head wire 8, a positive chip 9, a stator terminal 10, a negative chip 11, and a diode base 12. Diode base 12 is designed as a press-in diode base and a base having ground potential is pressed into the B end shield of the generator. The tie-in is provided with loops or U-shaped embossed features on the stator terminal, which is used for a simpler attachment of the connecting wires. A separate head wire for connecting the stator wires is also possible.

Figure 4A:
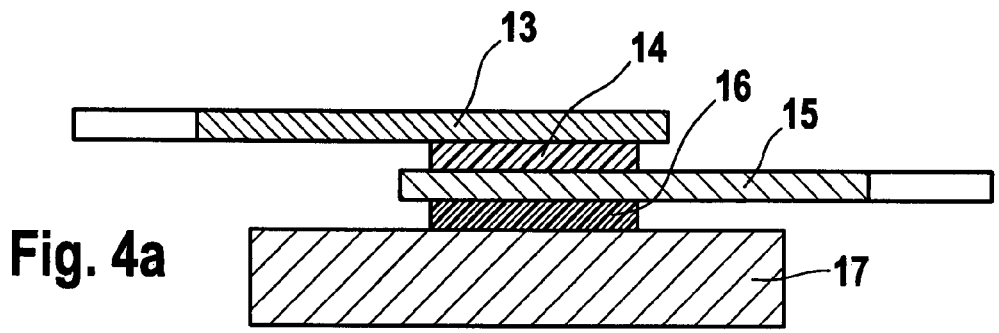
FIGS. 4a and 4b show the embodiment of a soldered diode in side sectional view and in top view.
Figure 4B:
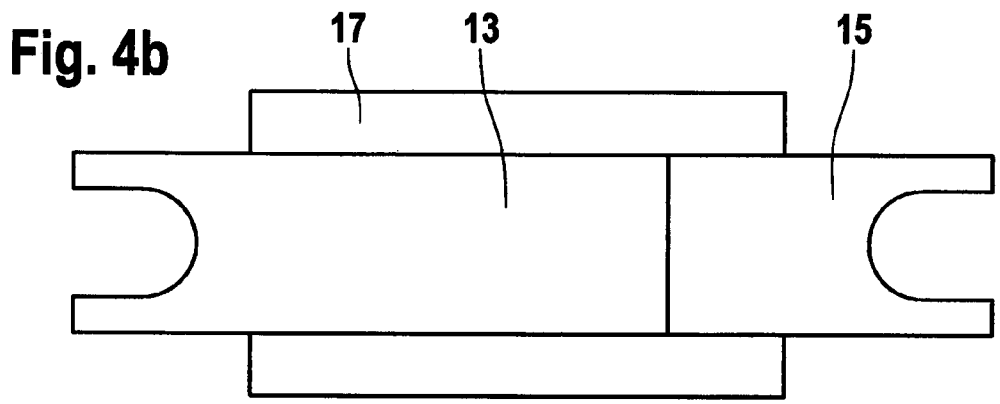

FIGS. 4a and 4b show an example embodiment as a soldered diode; FIG. 4a again shows the lateral section and FIG. 4b shows the top view. In particular, the systems show positive terminal 13, positive chip 14, stator terminal 15, negative chip 16, and diode base 17, the diode base being designed as a soldered base and preferably representing a base having ground potential, which is soldered to a heat sink, for example. Loops or U-shaped embossed features are provided on the stator terminal and on the positive terminal for simpler attachment of the connecting wires. A separate head wire is also possible. Further embodiments are such that the positive potential terminal is also soldered, comparably to a button CAN diode.

Figure 5:
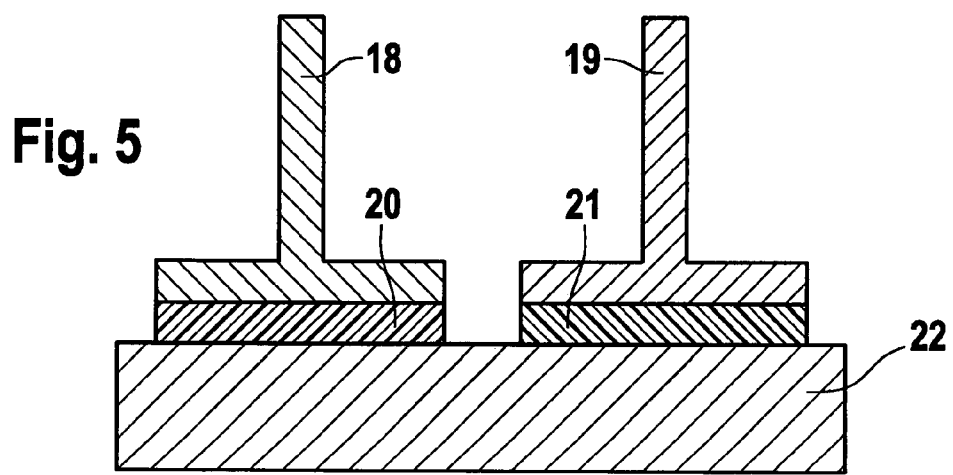
FIG. 5 shows the partitioning of two positive or negative chips in a housing.

FIG. 5 shows the partitioning of two positive or negative chips in a housing. Two head wires 18, 19, two chips 20, 21, and a shared diode base 22 are provided. The diode base is a soldered or a press-in base. Two chips are installed in a housing. For this purpose, two connecting wires are used and the base has positive or negative polarity. The stator terminals are connected to the head wires via a terminal board, for example.

Figure 6A:
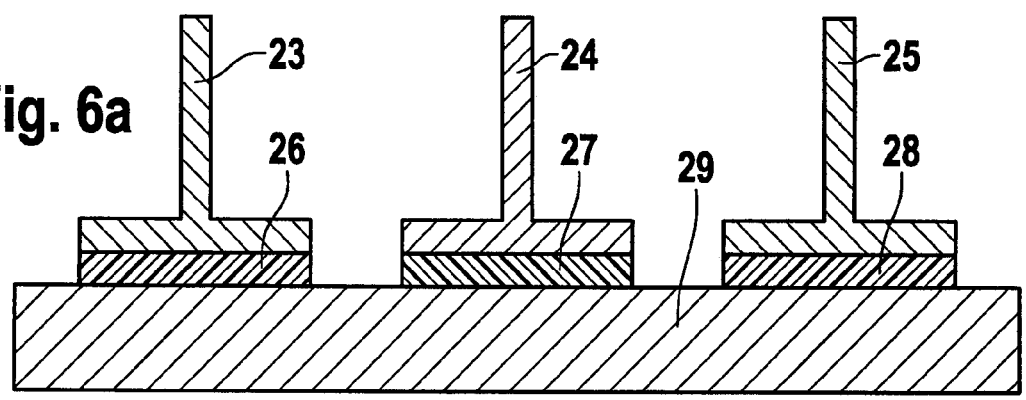
Figure 6B:
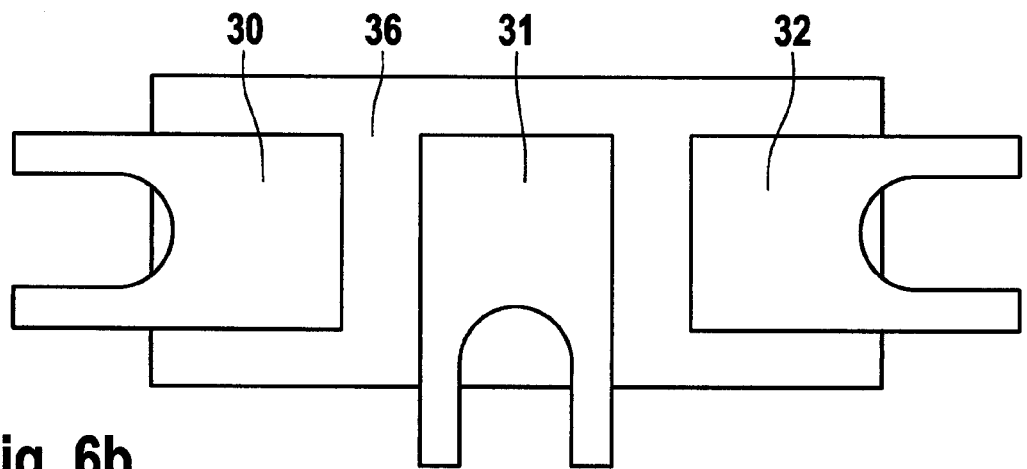
Figure 6C:
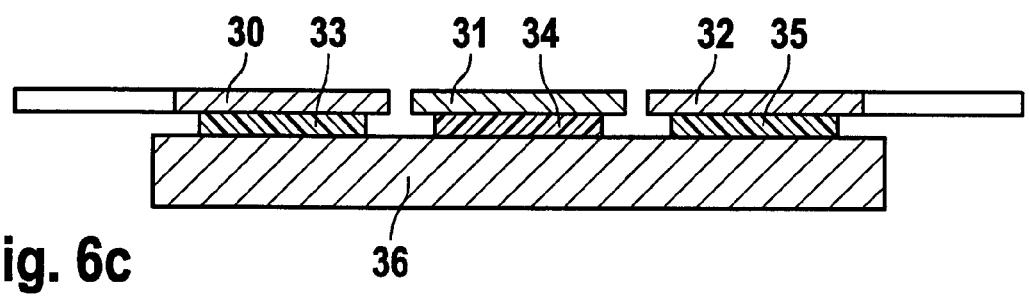

FIGS. 6a through 6c show partition options of three chips. There are three head wires 23, 24, 25, three chips 26, 27, 28, and a shared diode base 29. As an alternative, three stator terminal parts 30, 31, 32, three chips 33, 34, 35, and a diode base 36 are provided. Stator terminal parts 30, 31, 32 are preferably aligned in such a way that the central terminal part is rotated 90° relative to the two other terminal parts.

A soldered or press-in base is used as the base. The three chips are installed in a housing which has three connecting wires. The base has a positive or negative polarity. The stator terminals are connected to the short wires via the terminal board or, in another exemplary embodiment, via loops or U-shaped embossed features, which preferably engage in each other with the U-shaped embossed features of the other semirectifier, thus forming a joint attachment of the stator terminal wires.

FIGS. 7a and 7b show an exemplary embodiment having a partitioning of six chips in a housing. Also in this system, three stator terminal parts 37, 38, 39 are provided for each diode base 40. There are three chips between the stator terminal part and the diode base. This system is selected in duplicate, so that a system having six chips 41 through 46, which are installed in a shared housing, results on the soldered or press-in base. Three terminals for the stator wire make the connection of the corresponding stator windings possible. The base has a positive or negative polarity. The stator terminals are in turn produced via loops or U-shaped embossed features. Direct assembly of all diodes on the B-side end shield or on a separate heat sink is possible.

Another example embodiment, which is not depicted in the drawing, has HEDs and standard Zener diodes, i.e., Z diodes, which are parallel to each other for the load dump case. To increase the load dump protection of the HED rectifier, a Z diode is connected in parallel B+ B−, three Z diodes are connected in parallel to the positive or negative diodes, or two diodes are connected in parallel to each positive and each negative diode of each branch. In another embodiment, partitioning is done in such a way that HED and HS or Zener diodes are connected in parallel for temperature resistance. To prevent overload of the HED diode due to the positive loss gradient in the range over 197° C., the hottest HED diodes having higher temperature resistance are connected in parallel. This stabilizes the occurring power loss at the latest when the power loss of the temperature-resistant diodes is reached.

What is claimed is:

1. A high-efficiency Schottky diode device configured as a rectifier for a three-phase generator in a motor vehicle, comprising:
    a first Schottky diode; and
    a second semiconductor element monolithically integrated with the first Schottky diode as parts of a semiconductor chip;
        wherein the semiconductor chip has at least one trench structure,
        wherein the second semiconductor element includes one of an MOS-structure and a p-n diode, and
        wherein a conducting-state voltage is set by the metal for the Schottky barrier so that the conducting-state voltage is in the range of 0.5 V to 0.6 V, wherein a barrier height of approximately 0.65 eV to 0.75 eV is provided, and wherein a temperature range is above about 165° Celsius.

2. The high-efficiency Schottky diode device as recited in claim 1, wherein the MOS structure and the first Schottky diode forms a trench MOS barrier Schottky diode.

3. The high-efficiency Schottky diode device as recited in claim 1, wherein a plurality of trench structures is provided.

4. The high-efficiency Schottky diode device as recited in claim 1, wherein the trenches are approximately 1 μm to 3 μm deep and approximately 0.5 μm to 1 μm wide.

5. The high-efficiency Schottky diode device as recited in claim 4, wherein the distance between the two adjacent trenches is approximately 0.5 μm to 1 μm.

6. The high-efficiency Schottky diode device as recited in claim 1, wherein the semiconductor chip includes:
    a highly doped n+ substrate;
    an n epitaxial layer, wherein at least two trenches are etched into the epitaxial layer;
    a first metal layer provided as an anode;
    a second metal layer provided as a cathode; and
    an oxide layer located between the trenches and the first metal layer.

7. The high-efficiency Schottky diode device as recited in claim 6, wherein the semiconductor chip provides a combination of: a) a metal-oxide-semiconductor structure including the first metal layer, the oxide layer, and the epitaxial layer; and b) a Schottky diode including a Schottky barrier between the first metal layer as an anode and the n epitaxial layer as a cathode.

8. A rectifier system for a three-phase generator in a motor vehicle, comprising:
    a head wire;
    a stator terminal;
    a diode base;
    a positive chip disposed between the head wire and the stator terminal; and
    a negative chip disposed between the stator terminal and the diode base;
    wherein the rectifier system includes at least one high-efficiency Schottky diode device that includes a first Schottky diode and a second semiconductor element monolithically integrated as parts of a semiconductor chip and wherein the semiconductor chip has at least one trench structure, and wherein the second semiconductor element includes one of an MOS-structure and a p-n diode, and
    wherein a conducting-state voltage is set by the metal for the Schottky barrier so that the conducting-state voltage is in the range of 0.5 V to 0.6 V, wherein a barrier height of approximately 0.65 eV to 0.75 eV is provided, and wherein a temperature range is above about 165° Celsius.

9. The rectifier system as recited in claim 8, wherein the rectifier system is configured for the generator in the vehicle, and components of the rectifier system are mounted directly on a B end shield of the generator.

10. The rectifier system as recited in claim 8, wherein components of the rectifier system are mounted directly on a separate heat sink.

11. The rectifier system as recited in claim 8, wherein the rectifier system is configured for the generator in the vehicle, and wherein two high-efficiency Schottky diode devices on two chips are provided in a housing.

12. The rectifier system as recited in claim 8, wherein the at least one high-efficiency Schottky diode device is configured as a press-in diode.

13. The rectifier system as recited in claim 8, wherein at least two positive chips and at least two negative chips are connected to form the rectifier system.

14. The rectifier system as recited in claim 8, wherein the rectifier system is configured for a generator in a vehicle, and wherein stator terminal parts are provided which are connected to head wires of the at least one high-efficiency Schottky diode device via a terminal board.

15. The rectifier system as recited in claim 8, wherein at least one standard Zener diode is connected in parallel to the at least one high-efficiency Schottky diode device for producing load dump protection.

16. The rectifier system as recited in claim 8, wherein at least one standard Zener diode is connected in parallel to the at least one high-efficiency Schottky diode device for increasing the temperature resistance of the rectifier system.

17. The rectifier system as recited in claim 8, wherein each of the positive and negative chips includes one of the at least one high-efficiency Schottky diode device.

18. The rectifier system as recited in claim 17, wherein the positive and negative chips are situated in a housing.

19. The rectifier system as recited in claim 8, wherein the diode base is a press-in diode base.

20. The rectifier system as recited in claim 8, wherein the diode base has ground potential and is pressed into a B end shield of the generator in the vehicle.

21. The rectifier system as recited in claim 8, wherein the stator terminal includes a U shape feature.

22. A rectifier system for a three-phase generator in a motor vehicle, comprising:
    a stator terminal coupled between a positive chip and a negative chip;
    a diode base; and
    a high-efficiency Schottky diode device, including:
        a first Schottky diode; and
        a second semiconductor element monolithically integrated with the first Schottky diode as parts of a semiconductor chip;
    wherein the semiconductor chip has at least one trench structure,
    wherein the second semiconductor element includes a second Schottky diode,
    wherein a barrier metal of the first Schottky diode is different from a barrier metal of the second Schottky diode, and
    wherein a conducting-state voltage is set by the metal for the Schottky barrier so that the conducting-state voltage is in the range of 0.5 V to 0.6 V, wherein a barrier height of approximately 0.65 eV to 0.75 eV is provided, and wherein a temperature range is above about 165° Celsius.

23. The rectifier system as recited in claim 22, wherein a plurality of trench structures is provided, wherein the trenches are approximately 1 μm to 3 μm deep and approximately 0.5 μm to 1 μm wide, wherein the distance between the two adjacent trenches is approximately 0.5 μm to 1 μm.

24. The rectifier system as recited in claim 23, wherein the rectifier system includes:
- a highly doped n+ substrate;
- an n epitaxial layer, wherein at least two trenches are etched into the epitaxial layer;
- a first metal layer provided as an anode;
- a second metal layer provided as a cathode; and
- an oxide layer located between the trenches and the first metal layer.

25. The rectifier system as recited in claim 8, wherein a plurality of trench structures is provided, wherein the trenches are approximately 1 μm to 3 μm deep and approximately 0.5 μm to 1 μm wide, wherein the distance between the two adjacent trenches is approximately 0.5 μm to 1 μm.

26. The rectifier system as recited in claim 25, wherein the rectifier system includes:
- a highly doped n+ substrate;
- an n epitaxial layer, wherein at least two trenches are etched into the epitaxial layer;
- a first metal layer provided as an anode;
- a second metal layer provided as a cathode; and
- an oxide layer located between the trenches and the first metal layer.

27. A rectifier system for a generator in a vehicle, where temperatures of 165° Celsius or higher can arise, having a semiconductor device, comprising:
- a high-efficiency Schottky diode HED including a semiconductor chip having trench structures, a combination of at least one Schottky diode and another semiconductor element, monolithically integrated in the semiconductor chip, the another semiconductor element including a pn diode in the trench MOS-structure,
- wherein a conducting-state voltage (UF) is set by selecting a barrier metal that defines a barrier height (PhiBn) for a Schottky barrier so that a conducting-state voltage in a range of UF=0.5 V to 0.6 V results, and at the same time low blocking-state currents occur and a barrier height (PhiBn) of approximately 0.65 eV to 0.75 eV is selected.

* * * * *